United States Patent [19]

Beckenhauer et al.

[11] 4,146,909
[45] Mar. 27, 1979

[54] SYNC PATTERN ENCODING SYSTEM FOR RUN-LENGTH LIMITED CODES

[75] Inventors: Robert L. Beckenhauer; Werner J. Schaeuble, both of San Jose, Calif.

[73] Assignee: International Business Machines Corporation, Armonk, N.Y.

[21] Appl. No.: 853,377

[22] Filed: Nov. 21, 1977

[51] Int. Cl.² ............................................. G11B 5/09
[52] U.S. Cl. ..................................... 360/39; 358/261; 360/40
[58] Field of Search ................... 358/261; 360/39, 40, 360/48, 51

[56] References Cited

U.S. PATENT DOCUMENTS

| | | | |
|---|---|---|---|
| 3,641,525 | 2/1972 | Milligan | 360/40 |
| 3,870,870 | 3/1975 | Gabor | 360/40 |
| 4,020,282 | 4/1977 | Halpern | 360/40 |
| 4,041,453 | 8/1977 | Umeda et al. | 360/39 |

Primary Examiner—Vincent P. Canney
Attorney, Agent, or Firm—Richard E. Cummins

[57] ABSTRACT

A system which employs a parallel to serial converter and a serial shift register encoder for encoding a multibyte sync pattern in a fixed rate variable word length run-length limited code wherein less than a single character of data is supplied to the encoder from the parallel to serial converter to encode the multibyte sync pattern. The system provides for feeding a first portion of the encoded sync pattern back to the encoder through a serial decoder which provides a serial bit stream that is identical to the initial pattern provided to the encoder. Suitable control circuitry is employed to control the phasing of the end of the initial bit stream and the beginning of the decoded bit stream fed back to the encoder. Once the feedback path is established, the total length of the encoded sync pattern is independent of the single character initially supplied to the encoder.

27 Claims, 5 Drawing Figures

SYNC PATTERN ENCODING SYSTEM FOR RUN-LENGTH LIMITED CODES

FIELD OF THE INVENTION

This invention relates in general to systems for encoding data represented by binary signals and specifically for encoding a unique repetitive pattern in a fixed rate variable word length run-length limited code.

BACKGROUND OF THE INVENTION

In many digital data handling systems, a character of information is represented by a unique combination of 8 binary bits sometimes referred to as a byte. Generally, information is transferred between units of a data processing system and even within units on a byte basis, usually serial by byte. The storage of this data within the system, however, is sometimes done on a serial-by-bit, serial-by-byte basis as in a magnetic disk file storage unit. Information is therefore presented to the disk file in a serial-by-bit, serial-by-byte fashion for recording on one of a plurality of concentric recording tracks in the form of magnetic transitions occurring at predefined bit times. The recording process generally involves operating on a serial bit stream corresponding to a sequence of characters.

Various types of recording schemes have been developed in the art over the years to increase the amount of data that can be stored in the form of magnetic transitions on the magnetic media. It is known that for clocking purposes, transitions should be recorded at periodic intervals so that as the transitions are being read by a magnetic transducer and converted into a pulse stream, it is possible to divide the pulse stream into a series of bit times, generally by a variable frequency oscillator which is synchronized to predefined transitions. It is also known that a series of closely spaced transitions interact adversely with each other so that in many present day recording schemes, the serial input stream is encoded such as to prevent transitions occurring in adjacent bit cells on the magnetic media.

A class of codes have been developed in the art which are referred to as run-length limited codes. The characteristic of these codes is that a transition is guaranteed at least every "n" bit times. In these codes it is also guaranteed that adjacent transitions will be separated by at least "d" bit times. Practical examples for "d" and "n" are 2,7 and 1,4. A 2,7 run-length limited code therefore would guarantee at least two binary zeros between adjacent binary ones and no more than seven binary zeros in a sequence.

Run-length limited codes are also classified as fixed or variable rate codes. The fixed rate run-length limited code implies that the number of bits used to represent a code word is a fixed multiple of the number of bits in the data word prior to encoding, e.g., a two bit data word is encoded as a four bit code word, a three bit word is encoded as a six bit code word, etc. In a variable rate run-length limited code, there is no fixed relationship maintained in the encoding process between the number of bits in the data word and the number of bits in the code word.

Fixed length run-length codes have an advantage where the storage space is fixed, such as on a track of a magnetic disk.

Run-length limited codes are also classified as fixed or variable word length codes. The classification is in effect based on the arbitrary assignment of a combination of binary 1's and 0's in a data word code word dictionary which permits any stream of binary 1's and 0's to be divided into predefined data words.

An example of such a data word code word dictionary for a fixed rate variable word length 2,7 run-length limited code is shown below:

| Data Word | Code Word |
| --- | --- |
| 10 | 0100 |
| 010 | 100100 |
| 0010 | 00100100 |
| 11 | 1000 |
| 011 | 001000 |
| 0011 | 00001000 |
| 000 | 000100 |

A system and method for encoding and decoding the fixed rate variable word length 2,7 run-length limited code shown above is disclosed and claimed in copending application Ser. No. 807,999, filed June 20, 1977, entitled "Sequential Encoding and Decoding of Variable Word Length Fixed Rate Data Codes," and assigned to the assignee of the present invention. Application Ser. No. 807,999 is a continuation of application Ser. No. 466,360, filed May 2, 1974.

When an encoder of the type disclosed in this copending application is used in connection with the storage of data represented by 8 bit bytes, successive data characters are converted into a serial-by-bit, serial-by-byte stream of bits which are supplied to the encoder. This serial bit stream is in effect segmented into data words according to the above dictionary with each data word being encoded to provide the appropriate code word.

When data is stored on a disk file, regardless of the particular code, it is also necessary to record or store special marks or patterns along with the data. In many present day disk files synchronizing patterns or marks are stored prior to the data in order to provide a signal of known frequency to which the circuitry external to the file may be synchronized. Generally, the time required to synchronize the external circuitry, such as a variable frequency oscillator (VFO), is inversely proportional to the frequency of the recorded signal so that it is desirable to provide a signal having the highest possible frequency on the disk. Additionally, a sync pattern encoded at the highest possible frequency occupies less physical recording space on a track and hence allows more usable data to be stored.

In systems which do not employ run-length limited codes, the sync pattern is generally a series of alternate ones and zeros and can be generated quite easily by serializing the same one byte a number of times to generate the appropriate signal to the encoder. The problem becomes more complex however where the encoder functions to encode the serial input stream corresponding to the sequence of eight bit characters into a run-length limited code signal, because in order to encode the highest frequency pattern, which in the example disclosed above is 100100, a 3 bit data word of 010 must be sequentially supplied to the input of the encoder. It is of course possible to supply three different 8 bit characters to achieve an input bit stream of 24 bits consisting of eight sequential 010 groups which would result in a correct sync pattern from the encoder. However, this implementation requires additional hardware, and while the additional hardware for storing the three 8 bit bytes for generating the appropriate input signal might add additional cost to the function, the main disadvantage is the cost of the control hardware which would be required, especially where the part of the control hardware could be achieving some additional control function during the time the sync pattern has to be encoded and written on the disk. The present invention provides a system for encoding a sync pattern where only one 8 bit character has to be supplied to the system in order to encode a sync pattern which is several bytes or more in length.

SUMMARY OF THE INVENTION

In accordance with the present invention, a system is provided for encoding a sync pattern in a run-length limited code wherein the input signal to the encoder consists of a first sequence of binary bits, which sequence is less than the total number of bits used to represent a character, followed immediately by a second sequence of bits which are fed back from the output of the encoder through a decoder to provide a bit stream identical to the first sequence, but delayed an appropriate amount to provide a continuous input stream of the proper character to the encoder.

DESCRIPTION OF THE DRAWINGS

FIGS. 3A and 3B when arranged as shown in FIG. 3, is a chart illustrating the condition of the binary signals at various times and at major components of the system of FIG. 1.

DETAILED DESCRIPTION OF THE INVENTION

Figure 1:
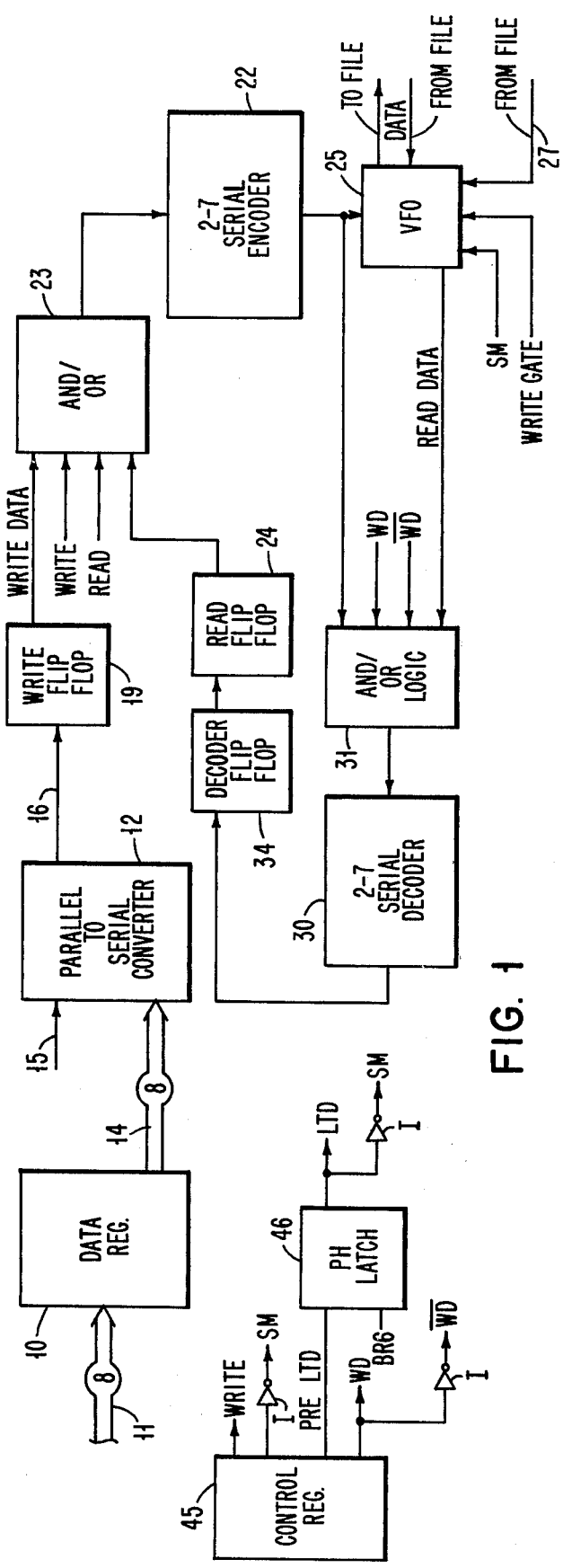
FIG. 1 is a schematic diagram of a system for encoding a sync pattern according to the present invention.

The system as shown in FIG. 1 comprises an 8 bit data register 10 which receives an 8 bit character on an input bus 11. The output of the data register 10 is connected to the input of a parallel to serial converter 12 by means of bus 14. Parallel to serial converter 12 is supplied with a clock input signal 15 which causes the 8 bit byte transferred from the data register 10 to be converted to a stream of eight serial bits on output line 16 of the converter 12.

The serial output signal on line 16 is supplied to a write data flip-flop 19 whose output is connected to the input of a 2,7 serial encoder 22 through a logical block 23. The function of logical block 23 is to selectively connect either the output of flip-flop 19 or the output of read data flip-flop 24 in the feedback path to the input of the 2,7 encoder 22.

The 2,7 encoder 22 is shown in block diagram only in this application in that the specific details of the encoder form no part of the present invention. The encoder may be embodied in the form disclosed in the previously mentioned copending application. The function of the encoder is to convert an input serial bit stream into an encoded serial bit stream which incorporates the run-length characteristics of the selected run-length limited code. As shown in FIG. 1, the output of the encoder is supplied to a variable frequency oscillator (VFO) 25 whose frequency is controlled by a signal 27 from the disk file (not shown) on which the data is to be stored.

The output of the encoder is also fed back through a logic block 31 to a 2,7 decoder 30. The decoder 30 is shown in block diagram in that the details of the decoder form no part of the present invention. Decoder 30 may be implemented in accordance with the specific details shown and described in the previously mentioned copending application.

A second logic block 31 is connected in the feedback path to selectively connect the output of the encoder 22 to the input of decoder 30 when a sync pattern is being encoded or alternately connect the read data output line of the VFO to the decoder 30 when data is being read from the file.

The output of decoder 30 is connected to a decoder output flip-flop 34 whose output is connected to the input terminal of read data flip-flop 24. As mentioned previously, the output of the read flip-flop 24 provides the feedback input to the encoder 22 through logic block 23.

The control signals for the various blocks are shown being generated by control register 45 which may be loaded from a suitable source. Register 45 is an 8 stage register which can be loaded at any byte time with an appropriate bit pattern to achieve the desired control. The control signals LTD and SM are generated from a polarity hold latch circuit 46. The output of latch 45 corresponds to the input signal at bit ring 6 time and is maintained at that lever until the next bit ring 6 time.

Figure 2:
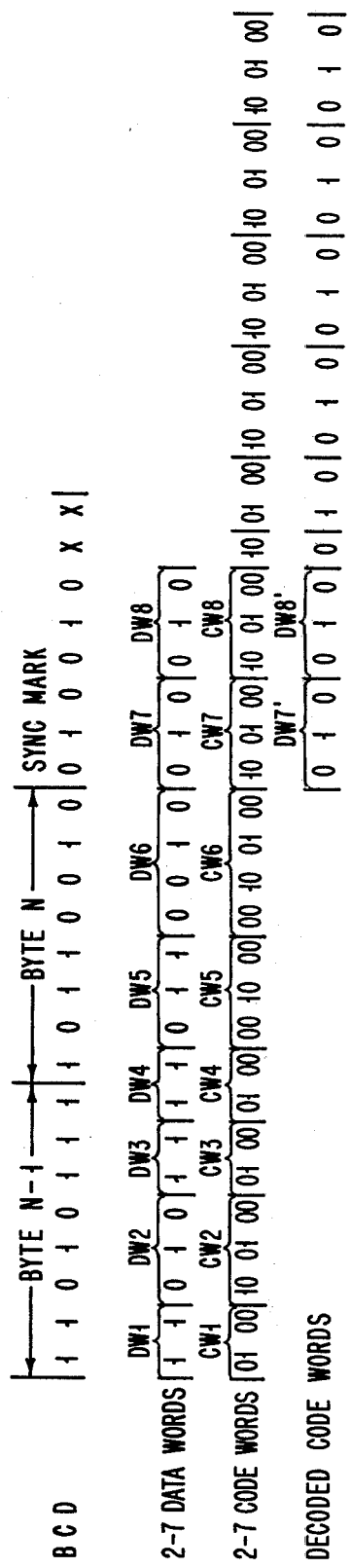
FIG. 2 is a diagram in binary notation illustrating an input stream of binary bits including a selected sync character to be encoded in accordance with the system shown in FIG. 1.

The operation of the system shown in FIG. 1 will now be explained in connection with encoding the data and sync patterns shown in FIG. 2 and with reference to the binary chart of FIG. 3.

Figure 3A:
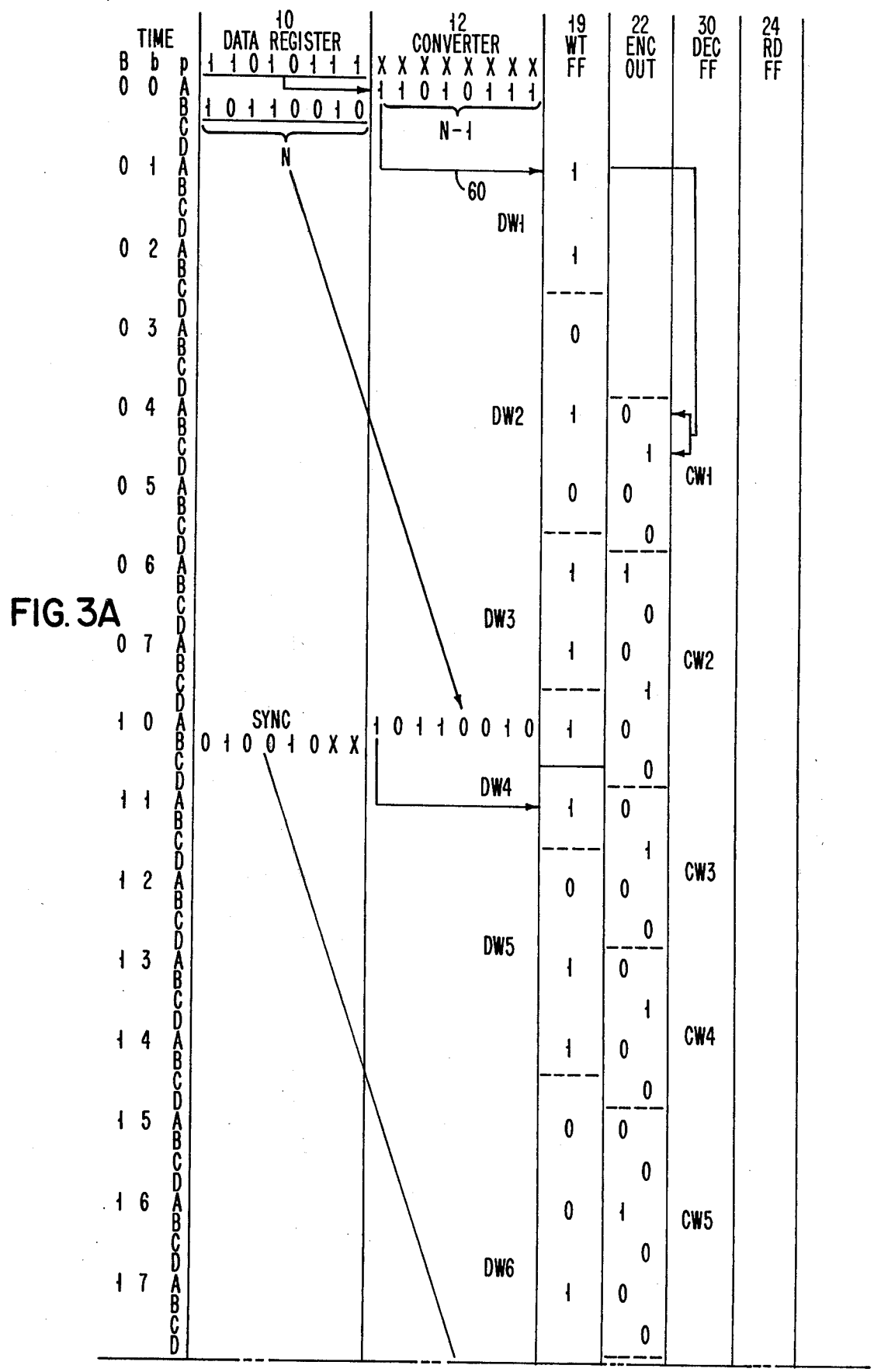

In the chart of FIG. 3, clock times are expressed in terms of byte and bit times and as shown each bit time is further divided into four phases; A, B, C and D. For example, byte 0, bit 6, phase C is expressed as B0b6C and this convention will be used to define times in the description of the operation which follows. Binary bits are shown in the chart at the time they are clocked into registers or flip-flops. An X represents a bit whose specific value may be a 1 or a 0 in that it does not matter to the operation of the system.

It will be assumed for purposes of explanation that byte n−1 is transferred to the parallel to serial converter 12 from data register 10 and that byte n is transferred to the data register for a source of data. It is further assumed that the signal sync character 010010XX is stored at some convenient location and can be supplied to the data register 10 at the appropriate time. As shown, the data register 10 is loaded in parallel at BXb0B time and the 8 bit character in the data register 10 is transferred to the serial-to-parallel converter 12 at BXb0A time immediately prior to loading the data register.

The above assumed conditions are shown in FIG. 3 on the line immediately above B0b0A. As shown, data register 10 contains the n−1 character of FIG. 2 10110110 while the parallel-to-serial converter 12 is loaded at B0b0A time with the n−1 character of FIG. 2 11010111. During times B0b1A through B1b0A the n−1 byte is converted to a serial pulse stream starting at the left most bit in converter 12 as indicated by the arrowed line 60 in FIG. 3. The state of the flip-flop 19 is represented by the column labeled 19WTFF. This signal is supplied to the input of the encoder 22. As explained in detail in the copending application Ser. No. 807,999 referred to earlier, a binary bit supplied to the encoder 22 provides an output of 2 binary bits two bit times later. As shown in FIG. 3, the first binary bit 1 of data word DW1 is converted into two bits 01 at times B0b4A and B0b4C. The second binary bit 1 of data word DW1 is converted into the two bits 00 at times B0b5A and B0b5C. The 4 bit code word 0100 designated CW1 in FIG. 3 is supplied to the VFO and to the file for storage thereon.

Data words DW2 through DW6 comprising the remainder of bytes n and n−1 are similarly encoded in the same manner.

According to the previous assumptions, a sync pattern is to be sent to the file at time B2b4A. With this assumption the sync character 010010XX is placed in the data register at time B1b0B and transferred to the converter 12 at time B2b0A as shown in FIG. 3. The first six bits 010010 of the sync character are designated DW7 and DW 8 in column 19 of FIG. 3. Each of these data words is converted to a six bit code word 100100 designated CW7 and CW8 in column 22 of FIG. 3. These 12 bits are supplied to the file and represent the initial portion of the sync pattern. Additionally, these bits are fed back to the encoder 22 through the decoder 30. As shown in FIG. 3 and as explained in the above referenced copending application, decoder 30 involves a two bit delay at the 1F frequency between its input and output. As shown in FIG. 3 the output of decoder 30 labeled DW7' appears at FF30 at time B2b6B for the first bit of code word CW7 which is supplied to the read data flip-flop 24 at time B2b6C. The first two bits 10 of code word CW7 are decoded as 0 at time B2b6b and supplied to flip-flop 24 at time B2b6C. The output of flip-flop 24 is supplied to the input of encoder 22 at time B2b7B which is the next clock time following the initial 6 bits supplied from the parallel-to-serial converter 12. Logic circuit 23 is therefore conditioned to switch the input to the encoder from the converter to flip-flop 24 at the end of clock time B2b6C.

It will be seen that once the initial bit is encoded, decoded and fed back to the encoder, no additional character need be supplied to the data register or the parallel serial converter to continue writing the sync pattern on the file. The length of the sync pattern is therefore solely controlled by input to the encoder from the feedback loop. No character other than the initial sync character need be supplied to the data register 10 or the serial converter 12.

While the invention has been particularly shown and described with reference to a preferred embodiment thereof, it will be understood by those skilled in the art that various changes in the form and details may be made therein without departing from the spirit and scope of the invention.

What is claimed is:

1. A method of generating a special signal pattern consisting of a plurality of sequential groups of binary bits arranged in a predefined sequence, successive pairs of said groups corresponding to one code word in a dictionary of code words for a run-length limited code, said method comprising;

generating a first signal consisting of two identical sequential data words, each of which corresponds to said one code word in said dictionary of code words, encoding said first signal on a serial by bit basis in accordance with said dictionary to provide a second signal which corresponds to a first portion of said special pattern, decoding said second signal on a serial by bit basis in accordance with said dictionary to provide a third signal which corresponds to said first signal, encoding said third signal as said first signal was encoded immediately following the encoding of said first signal to provide a fourth signal which corresponds to the remaining portion of said special pattern whereby when the signals generated by said second and fourth steps are combined on a time sequential basis said special signal pattern is formed.

2. The method set forth in claim 1 in which said run-length limited code is a fixed rate code.

3. The method set forth in claim 1 in which said run-length limited code is a variable word length code.

4. The method set forth in claim 1 in which said run-length limited code is a fixed rate, variable word length code.

5. The method set forth in claim 4 in which the run-lengths of said code are 2,7.

6. The method set forth in claim 5 in which said special signal pattern is adapted to be recorded on a magnetic disk.

7. The method set forth in claim 5 further including the step of recording said second and forth signals sequentially onto a track for a magnetic data storage unit to provide a signal for use in synchronizing another device with said unit prior to recording data from said storage unit.

8. The method set forth in claim 6 in which said predefined sequence is 100, said code word is defined in said dictionary as 100100 and said data word is defined in said dictionary as 010.

9. The method set forth in claim 8 in which the data word code word dictionary consists of the following words:

| Data Word | Code Word |
| --- | --- |
| 10 | 0100 |
| 010 | 100100 |
| 0010 | 00100100 |
| 11 | 1000 |
| 011 | 001000 |
| 0011 | 00001000 |
| 000 | 000100 |

10. The method of generating a sync pattern signal for recording onto a magnetic disk on which data is stored in a run-length limited code, said sync pattern signal having the highest obtainable frequency consistent with the constraints of said code and being generated by the same serial encoder employed to encode data to be stored on said disk, said method comprising the steps of:

converting a preselected data character representation into a serial bit stream, said character being selected so as to provide at least one group of serial adjacent bits, which group is identical to the data word associated with the code word in the run-length limited code dictionary having a bit pattern corresponding to a first portion of said sync pattern, supplying during a first period said one group of serial adjacent bits of said serial bit stream to said same serial encoder to provide an encoded output signal having a serial bit pattern corresponding to said sync pattern, decoding said encoded output signal to provide a feedback signal having a bit pattern identical to the said one group of said adjacent bits supplied to said encoder during said first period, supplying said feedback signal to said same serial encoder immediately after said first period, and supplying the output of said encoder to said disk file.

11. The method set forth in claim 10 in which said run-length limited code has a fixed rate and variable word lengths.

12. The method set forth in claim 11 in which said data is at least one group of serial adjacent bits is 010.

13. The method set forth in claim 12 in which said preselected data character is defined by the binary bit pattern of 010010XX, when X can be a binary 1 or binary 0.

14. The method set forth in claim 13 further including the step of recording the output signal from said encoder onto said disk file in order to read said recorded output signal prior to transfer of data from said file to another unit.

15. The method set forth in claim 14 in which the bit pattern of the encoded output signal is 100100.

16. The method set forth in claim 15 in which said dictionary comprises the following data word, code word definitions:

| Data Word | Code Word |
| --- | --- |
| 10 | 0100 |
| 010 | 100100 |
| 0010 | 00100100 |
| 11 | 1000 |
| 011 | 001000 |
| 0011 | 00001000 |
| 000 | 000100 |

17. In a system for recording data on a disk file wherein binary signals representing characters of data are presented to a run-length limited serial encoder which provides a coded serial by bit output signal representing corresponding characters, said encoder being connected to said file so said output signal is recorded on said disk file in the form of magnetic transitions, and a serial run-length decoder connected to said file for reading said transitions from said file and providing a decoded output signal;
a system for selectively recording a sync pattern on said file having the highest frequency permitted by the constraint said run-length limited code which limits the number of binary zeros between adjacent binary ones,
said system including means also connecting the output of said encoder selectively to said decoder and the output of said decoder selectively to the input of said encoder whereby once that an initial portion of said sync pattern is encoded, the remaining portion of said sync pattern is supplied to said disk file without supplying signals to the input of said encoder from a source external to said recording system.

18. The combination recited in claim 17 further including means for initially supplying to said encoder a bit pattern which is encoded into said initial portion of said sync pattern.

19. The combination recited in claim 18 in which said run-length limited code is a fixed rate, variable word length code.

20. The combination recited in claim 18 in which said bit pattern which is encoded into said initial portion is 010.

21. The combination recited in claim 19 in which said constraint is two 0's and said sync pattern comprises a sequence of groups, each group having a 100 bit pattern.

22. The combination recited in claim 18 in which said encoder and decoder operate on a run-length limited code defined by the following data word, code word dictionary:

| Data Word | Code Word |
| --- | --- |
| 10 | 0100 |
| 010 | 100100 |
| 0010 | 00100100 |
| 11 | 1000 |
| 011 | 001000 |
| 0011 | 00001000 |
| 000 | 000100 |

23. A recorded channel for a disk file adapted to be connected between a source of data to be stored on said file and the magnetic transducer of said file, said channel including
means connected to said source of data for receiving a plurality of binary signals in parallel representing one character,
means for converting said parallel signals to a serial stream of binary bit signals corresponding to said character,
an encoder connected to said connecting means for encoding said serial stream into an encoded serial stream wherein adjacent 1 bits are always separated by at least two binary zeros and there are never more than seven continuous binary 0 bits,
means connecting the output of said encoder to supply said encoded stream to said magnetic transducer,
a decoder connected to said transducer adapted to receive encoded data signals from said file and provide a decoded output signal,
means selectively connecting the output of said encoder to the input of said decoder to also provide a decoder output signal corresponding to said input signal to said encoder,
means for selectively connecting the output of said decoder to the input of said encoder, and
control means connected to both said means for selectively connecting and operable to cause said encoder and decoder to be connected in a continuous signal loop whereby said encoder provides a predefined repetitive pattern of binary bits to said disk file in response to operation of said control means.

24. The combination recited in claim 23 further including means for selectively connecting said converting means to said encoder, and
means for connecting said control means to said further means operable to cause said further means to disconnect said converter from said encoder when the output of said decoder is connected to the input of said encoder.

25. The combination recited in claim 24 in which said one character is defined as 010010XX where X is either a binary 1 or a binary 0.

26. The combination recited in claim 25 in which said encoded serial stream consists of a sequence of groups of binary bits each group comprising a 100 bit pattern.

27. The combination recited in claim 26 in which said encoder and decoder operate on a run-length limited code defined by the following data word, code word dictionary:

| Data Word | Code Word |
| --- | --- |
| 10 | 0100 |
| 010 | 100100 |
| 0010 | 00100100 |
| 11 | 1000 |
| 011 | 001000 |
| 0011 | 00001000 |
| 000 | 000100 |

* * * * *